(12) United States Patent
Kadota

(10) Patent No.: US 7,643,545 B2
(45) Date of Patent: Jan. 5, 2010

(54) CALIBRATING AUTOMATIC TEST EQUIPMENT TO ACCOUNT FOR MAGNITUDE AND PHASE OFFSETS

(75) Inventor: Toshihide Kadota, Poway, CA (US)

(73) Assignee: Teradyne, Inc., North Reading, MA (US)

( * ) Notice: Subject to any disclaimer, the term of this patent is extended or adjusted under 35 U.S.C. 154(b) by 751 days.

(21) Appl. No.: 11/094,934

(22) Filed: Mar. 31, 2005

(65) Prior Publication Data
US 2006/0222062 A1 Oct. 5, 2006

(51) Int. Cl.
*H04B 3/46* (2006.01)
(52) U.S. Cl. ........................ 375/224; 375/225; 370/229; 370/230; 370/232; 370/233; 324/601
(58) Field of Classification Search ................ 375/224, 375/225; 370/229, 230, 232, 233; 324/601
See application file for complete search history.

(56) References Cited

U.S. PATENT DOCUMENTS

| | | | | |
|---|---|---|---|---|
| 6,249,128 B1* | 6/2001 | Begg | ........................ | 324/601 |
| 2003/0231723 A1* | 12/2003 | Hansen | ...................... | 375/343 |
| 2006/0034356 A1* | 2/2006 | Fechtel | ...................... | 375/219 |
| 2006/0224343 A1* | 10/2006 | Visser et al. | .................. | 702/85 |

* cited by examiner

*Primary Examiner*—Mohammad H Ghayour
*Assistant Examiner*—Zewdu Kassa
(74) *Attorney, Agent, or Firm*—Fish & Richardson P.C.

(57) ABSTRACT

A method of calibrating automatic test equipment (ATE) having transmission paths that transport signals includes obtaining amplitude gains of the signals across the transmission paths, obtaining phase delays of the signals across the transmission paths, obtaining magnitude and phase offsets associated with the signals based on the amplitude gains and the phase delays, and calibrating the ATE using the magnitude and phase offsets.

16 Claims, 4 Drawing Sheets

CALIBRATING AUTOMATIC TEST EQUIPMENT TO ACCOUNT FOR MAGNITUDE AND PHASE OFFSETS

TECHNICAL FIELD

This patent application relates generally to calibrating automatic test equipment to account for magnitude and phase offsets caused by transmission paths.

BACKGROUND

Automatic test equipment (ATE) refers to an automated, usually computer-driven, approach to testing devices, such as semiconductors, electronic circuits, and printed circuit board assemblies. ATE typically includes at least two basic transmission paths: a source path and a capture path. The source path is used to transmit signals to a device under test (DUT), and the capture path is used to obtain signals from the DUT.

The source path and the capture path both include transmission media, over which source and capture signals pass. Differences in mechanical and electrical properties of the transmission media, however slight, can affect the source and capture signals. For example, the transmission media may cause unintended phase delays in signals in both the source path and the capture path. Similarly, the transmission media can affect the amplitudes of such signals. Typically, amplitude losses result during transmission, however, unintended amplitude gains may also result. In ATE parlance, amplitude gains and losses are both referred to as "gains"—since a loss in amplitude is the equivalent of a negative gain.

Phase delays and amplitude gains in the source path and capture path can have a negative effect on the accuracy of the ATE.

SUMMARY

This application provides apparatus and methods, including computer program products stored on one or more machine-readable media, for calibrating ATE to account for magnitude and phase offsets caused by transmission paths.

In general, in one aspect, the invention is directed to a method of calibrating automatic test equipment (ATE) that includes transmission paths that transport signals. The method includes obtaining amplitude gains of the signals across the transmission paths, obtaining phase delays of the signals across the transmission paths, obtaining magnitude and phase offsets associated with the signals based on the amplitude gains and the phase delays, and calibrating the ATE using the magnitude and phase offsets. This aspect may also include one or more of the following features.

The amplitude gains may be positive or negative deviations from initial values of the signals. The transmission paths may include an inphase (I) transmission path and a quadrature (Q) transmission path. The amplitude gains may include a Gain_II gain across the I transmission path, a Gain_QQ gain across the Q transmission path, and gains across combinations of the I and Q transmission paths. The gains across the combinations of the I and Q transmission paths may include a Gain_IQ gain from the I transmission path to the Q transmission path, and a Gain_QI gain from the Q transmission path to the I transmission path. The phase delays may include a Phase_II phase delay across the I transmission path, a Phase_QQ phase delay across the Q transmission path, and phase delays across combinations of the I and Q transmission paths. The phase delays across the combinations of the I and Q transmission paths may include a Phase_IQ phase delay from the I transmission path to the Q transmission path, and a Phase_QI phase delay from the Q transmission path to the I transmission path.

The ATE may include a source path and a capture path. The source path may provide signals to a device under test (DUT) and the capture path may signals from the DUT. Obtaining the magnitude and phase offsets may include calculating a source-path magnitude offset and a source-path phase offset for the source path, and calculating a capture-path magnitude offset and a capture-path phase offset for the capture path. Calibrating the ATE may include calibrating the source path using the source-path magnitude offset and the source-path phase offset, and calibrating the capture path using the capture-path magnitude offset and the capture-path phase offset.

The source-path magnitude offset may be calculated as follows: Gain_II minus Gain_QI, where the source-path phase offset is calculated as follows: Phase_II minus Phase QI, where the capture-path magnitude offset is calculated as follows: Gain_II minus Gain_IQ, and where the capture-path phase offset may be calculated as follows: Phase_II minus PhaseIQ. Alternatively, the source-path magnitude offset may be calculated as follows: Gain_IQ minus Gain_QQ, where the source-path phase offset is calculated as follows: Phase_IQ minus Phase QQ, where the capture-path magnitude offset is calculated as follows: Gain_QI minus Gain_QQ, and where the capture-path phase offset is calculated as follows: Phase_QI minus PhaseQQ.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
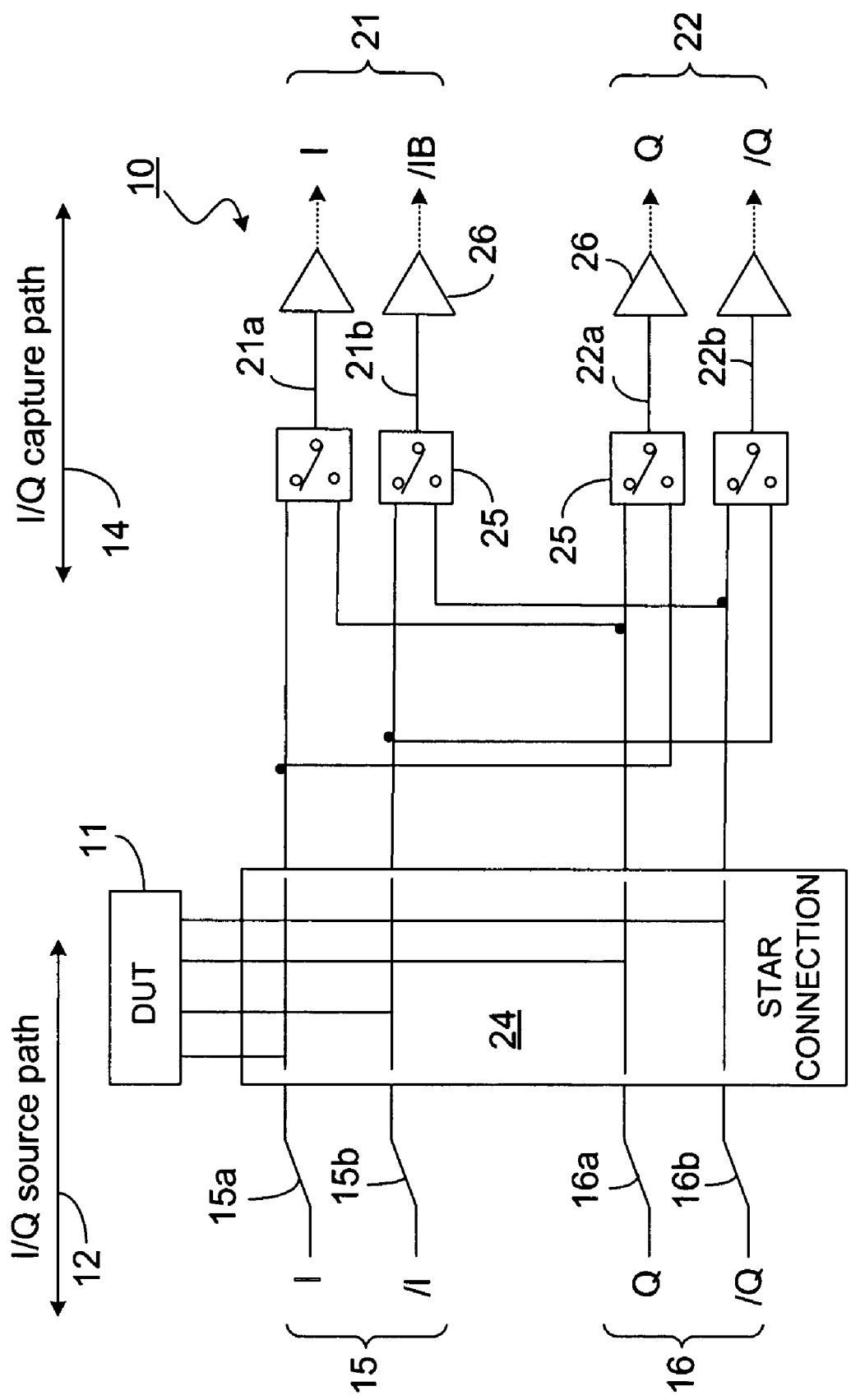
FIG. 1 is a block diagram of an ATE device (or handler) interface board (DIB).

FIG. 1 is a block diagram of ATE 10 for testing a DUT 11. As shown in FIG. 1, ATE 10 includes a source path 12 and a capture path 14. Source path 12 is used to transmit signals from ATE test equipment, a device interface board (DIB) and/or other testing equipment (not shown) to DUT 11. Capture path 14 is used to transmit signals from DUT 11 to circuitry on ATE 10, such as a processing device (e.g., a digital signal processor (DSP)) or the DIB. In a practical example, source path 12 may transmit test signals to DUT 11, and the DUT's reaction to those test signals may be measured via capture path 14. It is noted, however, that the source and capture path signals may be independent of one another.

Figure 4:
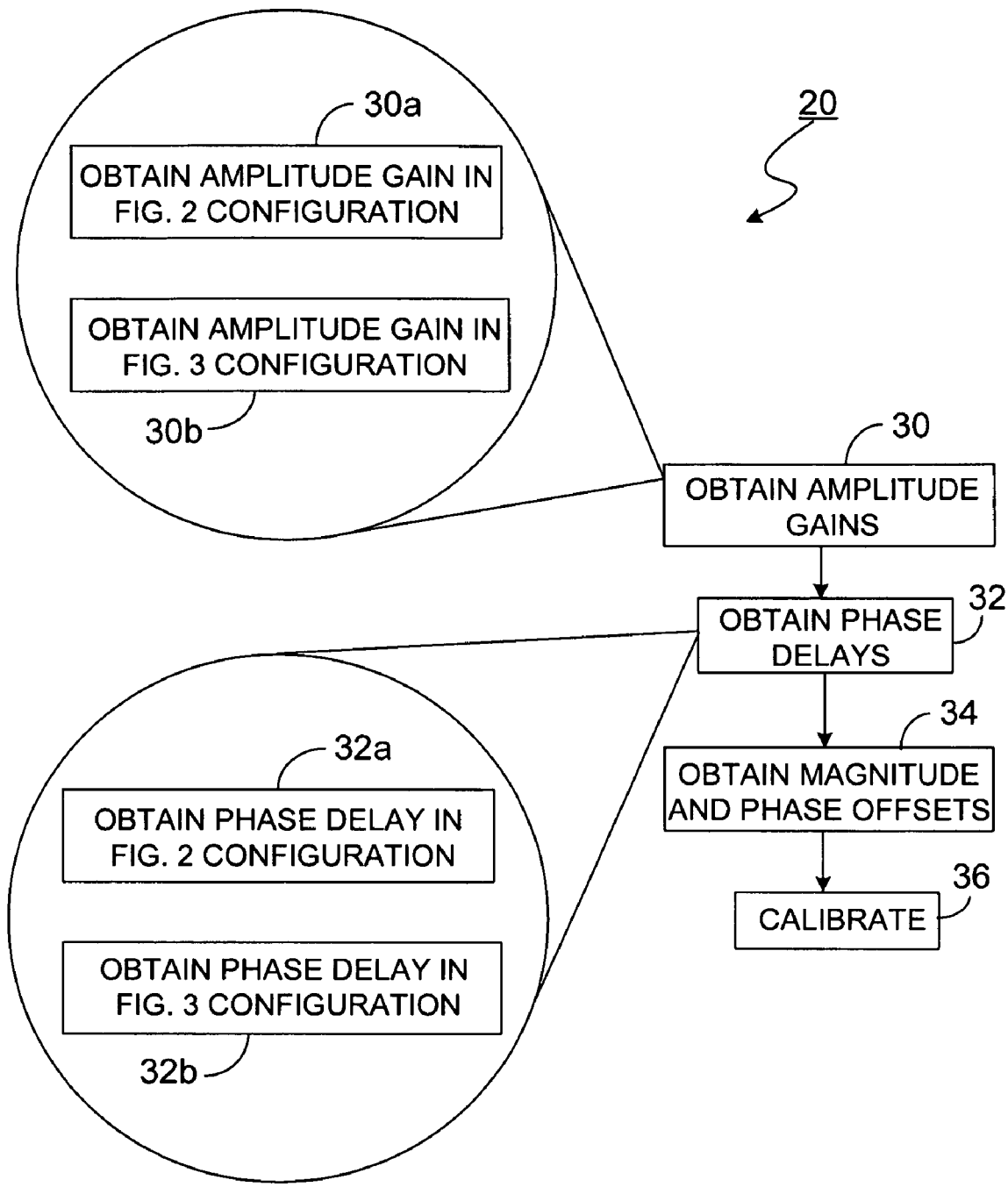
FIG. 4 is a flowchart of a process for calibrating the ATE of FIG. 1.

In the example of FIG. 1, source path 12 contains two sets of transmission lines. The transmission lines include inphase (I) transmission lines 15 and quadrature (Q) transmission lines 16. The signals transmitted over I transmission lines 15 are initially 90° out of phase from the signals transmitted over Q transmission lines 16. This phase differential is typically changed unintentionally during transmission. Calibration process 20 of FIG. 4 is used to generate phase (and magnitude) offsets to compensate for such changes. Source path 12 may contain more transmission lines than those shown.

As shown in FIG. 1, I transmission lines 15 include a base I transmission line 15a and a complementary I transmission line 15b, labeled /I. The two I transmission lines transmit signals that are 180° out of phase from one another, and are coupled to ensure that the requisite phase differential is maintained between the lines. Likewise, Q transmission lines 16 include a base Q transmission line 16a and a complementary Q transmission line 16b, labeled /Q. As was the case with the I transmission lines, the two Q transmission lines transmit signals that are 180° out of phase from one another, and are coupled to ensure that the requisite phase differential is maintained between the lines.

Capture path 14 also contains I transmission lines 21, including a base I transmission line 21a and a complementary I transmission line 21b, labeled /I. Capture path 14 contains Q transmission lines 22, including a base Q transmission line 22a and a complementary Q transmission line 22b, labeled /Q. The phase relationships of signals transmitted in the capture path I and Q transmission lines is the same as the phase relationships of signals transmitted in the source path I and Q transmission lines. Capture path 14 may contain more transmission lines than those shown. The same problems stemming from transmission that occur in the source path also occur in the capture path. Calibration process 20 may be used to substantially correct such problems.

A star connection 24 is used in the example of FIG. 1 to connect ATE 10 to DUT 11. Star connection 24 may be a matrix of switches and/or relays (not shown) to implement line-to-line connections between signal paths of ATE 10 and signal paths of DUT 11. It is noted that connectors other than star connection 24 may be used with ATE 10.

During actual DUT testing, star connection 24 connects source path 12 to DUT 11 and capture path 14 to DUT 11. During DUT testing, connections may, or may not, be made directly between source path 12 and capture path 14. During calibration of ATE 10, as described below, star connection 24 connects source path 12 directly to capture path 14, leaving DUT 11 disconnected from ATE 10.

Capture path 14 also includes switches 25 and operational amplifiers 26. Switches 25 may be implemented using transistors that are gated by control signals (not shown). Other types of switching elements with different control mechanisms may also be used. Switches 25 are used to configure capture path 14. That is, switches 25 control whether signals from DUT 11 are output to I transmission lines 21 or to Q transmission lines 22. Switches 25 are also used during calibration, as described below.

Operational amplifiers 26 may be unity gain amplifiers or may amplify signals output on corresponding transmission lines according to a predetermined gain. Amplifiers 26 may be omitted and/or other circuitry (not shown) may also be included at the output of the transmission lines on capture path 14. The same holds true for source path 12.

As noted, during calibration, DUT 11 is disconnected from ATE 10, and the source transmission lines and capture transmission lines are connected. Calibration is performed using gains and offsets measured across the entire length of the transmission lines, since it is difficult to measure the source path and capture path values directly, as noted below.

In the following, source path losses (negative gains) are defined as $dIs\_m$ and $dQs\_m$, and source path phase delays are defined as $dIs\_p$ and $dQs\_p$. Capture path losses are defined as $dIc\_m$ and $dQc\_m$, and capture path phase delays are defined as $dIc\_p$ and $dQc\_p$. The magnitude offset between the I and Q transmission lines—the I/Q offset—is defined for the source path as I/Qsrc_offset_M; the I/Q magnitude offset for the capture path is defined as I/Qcap_offset_M; the I/Q phase offset for the source path is defined as I/Qsrc_offset_P; and the I/Q phase offset for the capture path is defined as IQcap_offset_P. Thus, in terms of the foregoing variables:

$$I/Qsrc\_offset\_M = (dIs\_m - dQs\_m)$$

$$I/Qsrc\_offset\_P = (dIs\_p - dQs\_p)$$

$$I/Qcap\_offset\_M = (dIc\_m - dQc\_m)$$

$$I/Qcap\_offset\_P = (dIc\_p - dQc\_p) \qquad \text{(Eqs. 1)}$$

As noted above, however, $dIs\_m$, $dQs\_m$, $d,Is\_p$, $dQs\_p$, $dIc\_m$, $dQc\_m$, $d,Ic\_p$, and $dQc\_p$ cannot be measured, or cannot be measured easily. This is due, in part, to difficulties in accessing DUT pins during testing. However, the gains and phase delays across the entire lengths of the source and capture transmission lines can be measured relatively easily. These values can be used to calculate, to within a close approximation, values for the I/Q magnitude and phase offsets for both the source and capture paths, i.e., values for I/Qsrc_offset_M, I/Qsrc_offset_P, I/Qcap_offset_M, and I/Qcap_offset_P.

To derive the formulas for the I/Q offsets, the following variables are defined. Gain_II is the amplitude loss or gain across source I transmission lines 15 and capture I transmission lines 21; Phase_II is the phase delay across source I transmission lines 15 and capture I transmission lines 21; Gain_QQ is the amplitude loss or gain across source Q transmission lines 16 and capture Q transmission lines 22; Phase_QQ is the phase delay across source Q transmission lines 16 and capture Q transmission lines 22; Gain_IQ is the amplitude loss or gain across source I transmission lines 15 and capture Q transmission lines 22; Phase_IQ is the phase delay across source I transmission lines 15 and capture Q transmission lines 22; Gain_QI is the amplitude loss or gain across source Q transmission lines 16 and capture I transmission lines 21; and Phase_QI is the phase delay across source Q transmission lines 16 and capture I transmission lines 21.

Figure 2:
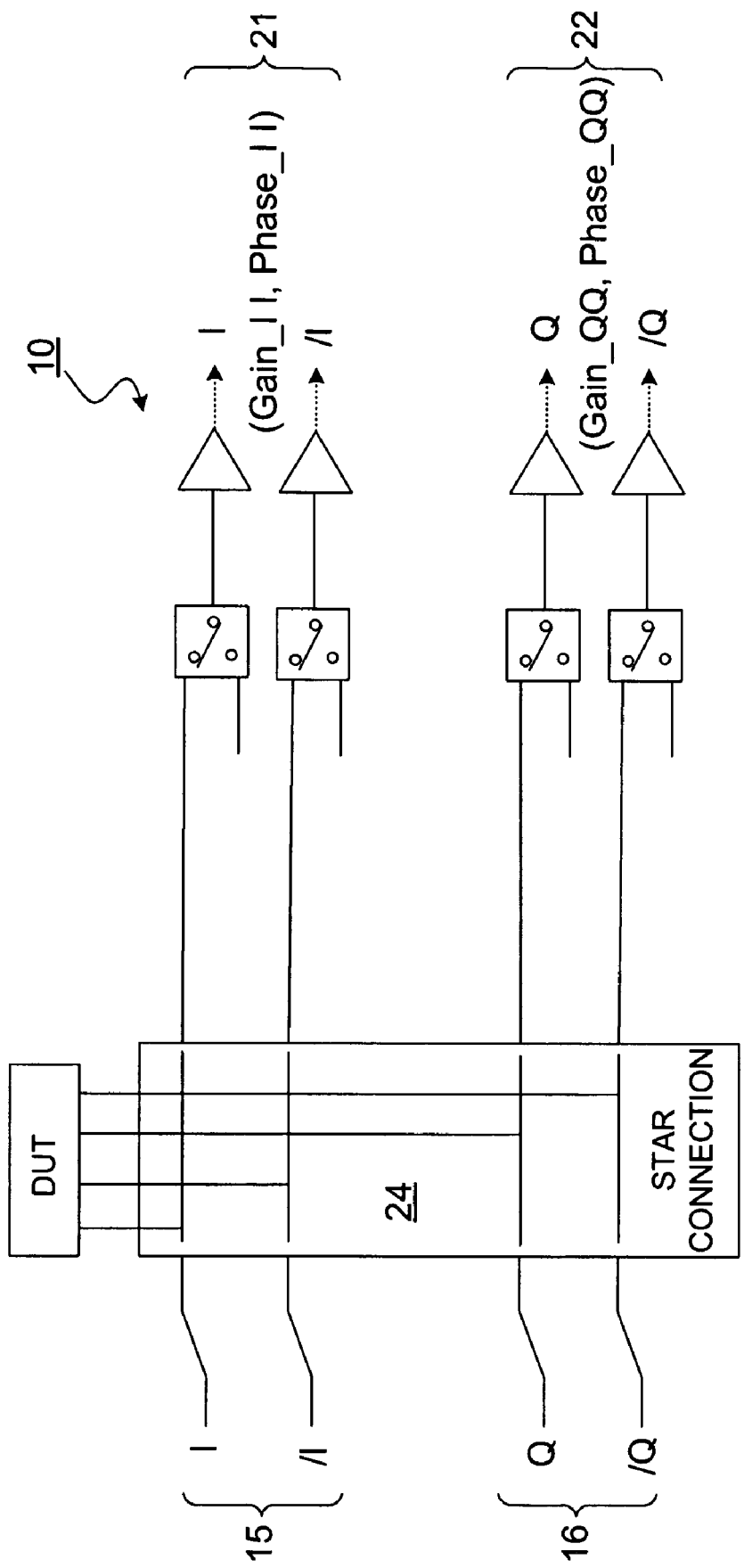
FIGS. 2 and 3 are switching connection diagrams showing the ATE DIB of FIG. 1 with different switching connections.

The values of Gain_II, Phase_II, Gain_QQ, and Phase_QQ are obtained by connecting switches 25 in the configuration shown in FIG. 2. In this configuration, the source path and capture path I transmission lines 15 and 21 are connected, and the source path and capture path Q transmission lines 16 and 22 are connected. The values for Gain_II, Phase_II, Gain_QQ, and Phase_QQ are measured at the ATE's processing device (e.g., its DSP) by comparing signals output on the source path to the same signals received via the capture path. The resulting amplitude gain and phase delays correspond to Gain_II, Phase_II, Gain_QQ, and Phase_QQ. It is noted that the gains and phase delays are determined with respect to the base signal only (e.g., I and Q), not the complementary signals (e.g., /I and /Q). This is because the base and complementary signals are coupled and, as a result, the gains and phase delays are the same for both.

Figure 3:
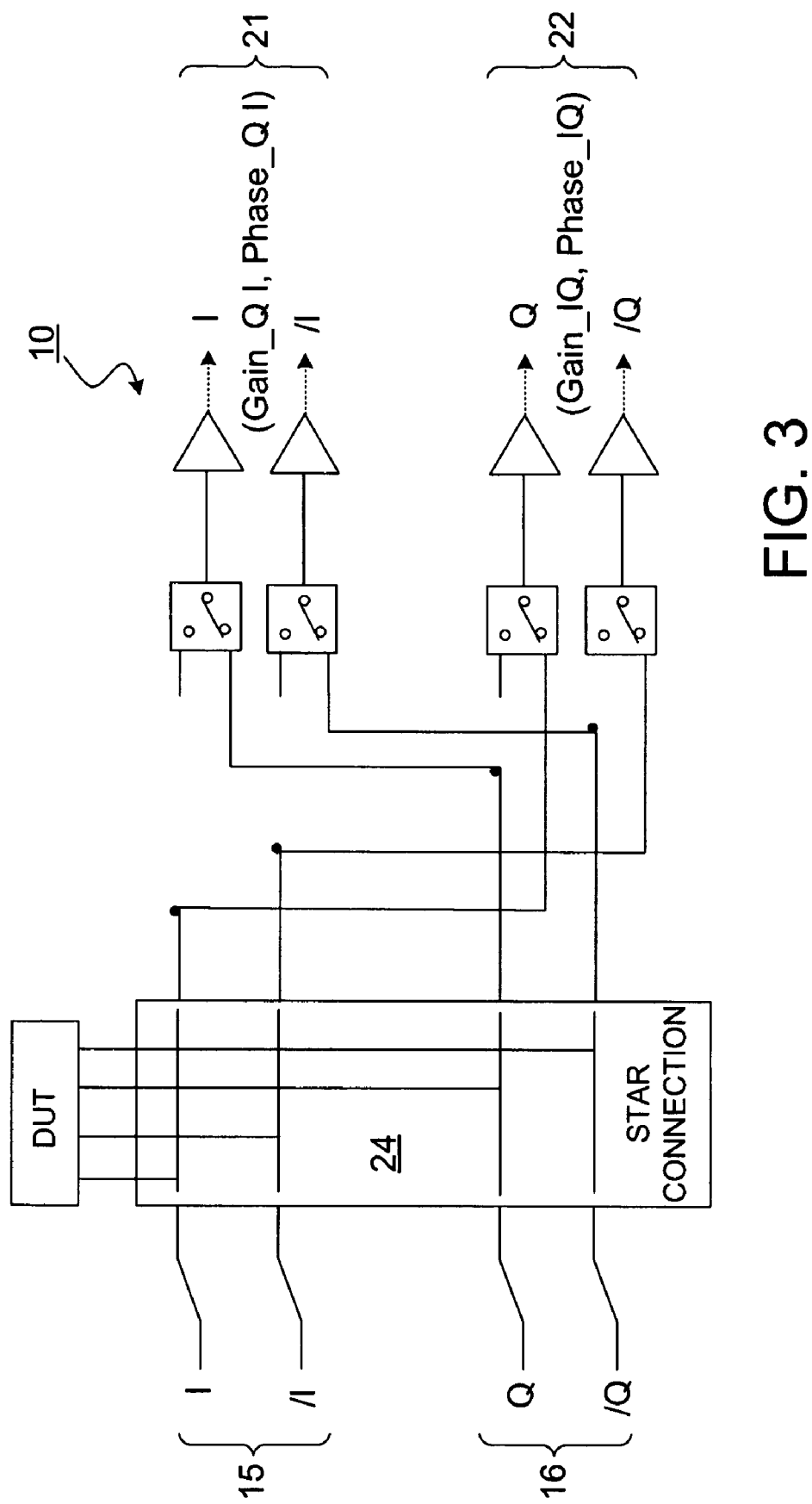

The values of Gain_IQ, Phase_IQ, Gain_QI, and Phase_QI are obtained by connecting switches 25 in the configuration shown in FIG. 3. In this configuration, the source path I transmission lines 15 are connected to the capture path Q transmission lines 22, and the source path Q transmission lines 16 are connected to the capture path I transmission lines 21. As was the case above, the values for Gain_IQ, Phase_IQ, Gain_QI, and Phase_QI are measured at the ATE's processing device by comparing signals output on the source path to the same signals received via the capture path. The resulting amplitude gain and phase delays correspond to Gain_IQ, Phase_IQ, Gain_QI, and Phase_QI.

The gains and phase delays can be expressed as follows:

$$Gain\_IQ = dIs\_m + dQc\_m$$

$$Gain\_II = dIs\_m + dIc\_m$$

$$Gain\_QQ = dQs\_m + dQc\_m$$

$$Gain\_QI = dQs\_m + dIc\_m$$

$$Phase\_IQ = dIs\_p + dQc\_p$$

$$Phase\_II = dIs\_p + dIc\_p$$

$$Phase\_QQ = dQs\_p + dQc\_p$$

$$Phase\_QI = dQs\_p + dIc\_p \quad \text{(Eqs. 2)}$$

Eqs. 1 may be redefined as follows. Specifically, zero sums, e.g., (dIc_m−dIc_m), are introduced into Eqs. 1, and the variables are rearranged as follows:

$$\begin{aligned} I/Qsrc\_offset\_M &= (dIs\_m - dQs\_m) \quad \text{(Eqs. 3)}\\ &= (dIs\_m - dQs\_m) + (dIc\_m - dIc\_m)\\ &= (dIs\_m + dIc\_m) - (dQs\_m + dIc\_m)\\ &= (dIs\_m - dQs\_m) + (dQc\_m - dQc\_m)\\ &= (dIs\_m + dQc\_m) - (dQs\_m + dQc\_m) \end{aligned}$$

$$\begin{aligned} I/Qsrc\_offset\_P &= (dIs\_p - dQs\_p)\\ &= (dIs\_p - dQs\_p) + (dIc\_p - dIc\_p)\\ &= (dIs\_p + dIc\_p) - (dQs\_p + dIc\_p)\\ &= (dIs\_p - dQs\_p) + (dQc\_p - dQc\_p)\\ &= (dIs\_p + dQc\_p) - (dQs\_p + dQc\_p) \end{aligned}$$

$$\begin{aligned} I/Qcap\_offset\_M &= (dIc\_m - dQc\_m)\\ &= (dIc\_m - dQc\_m) + (dIs\_m - dIs\_m)\\ &= (dIs\_m + dIc\_m) - (dIs\_m + dQc\_m)\\ &= (dIc\_m - dQc\_m) + (dQs\_m - dQs\_m)\\ &= (dQs\_m + dIc\_m) - (dQs\_m + dQc\_m) \end{aligned}$$

$$\begin{aligned} I/Qcap\_offset\_P &= (dIc\_p - dQc\_p)\\ &= (dIc\_p - dQc\_p) + (dIs\_p - dIs\_p)\\ &= (dIs\_p + dIc\_p) - (dIs\_p + dQc\_p)\\ &= (dIc\_p - dQc\_p) + (dQs\_p - dQs\_p)\\ &= (dQs\_p + dIc\_p) - (dQs\_m + dQc\_p) \end{aligned}$$

Combining Eqs. 2 and Eqs. 3 results in the following:

$$\begin{aligned} I/Qsrc\_offset\_M &= Gain\_II - Gain\_QI \quad \text{(Eqs. 4)}\\ &= Gain\_IQ - Gain\_QQ\\ I/Qsrc\_offset\_P &= Phase\_II - Phase\_QI\\ &= Phase\_IQ - Phase\_QQ\\ I/Qcap\_offset\_M &= Gain\_II - Gain\_IQ\\ &= Gain\_QI - Gain\_QQ\\ I/Qcap\_offset\_P &= Phase\_II - Phase\_QI\\ &= Phase\_QI - Phase\_QQ \end{aligned}$$

Thus, by virtue of Eqs. 4, the magnitude and phase offsets (or close approximations thereof) for the source and capture paths can be determined using values that are easily measured, i.e., Gain_II, Phase_II, Gain_QQ, Phase_QQ, Gain_IQ, Phase_IQ, Gain_QI, and Phase_QI.

FIG. 4 shows a process 20 for calibrating ATE 10 that uses Eqs. 4. The execution of process 20 will be described in the context of ATE 10 shown in FIGS. 1 to 3. It is noted, however, that process 20 may be used with ATE having other configurations and/or other numbers of transmission lines, e.g., more or less than four.

Process 20 obtains (30) the amplitude gains Gain_IQ, Gain_II, Gain_QQ, and Gain_QI in the manner described above. That is, process 20 configures switches 25 appropriately, send signals along the I and Q transmission lines, and compares the signals that were input to the resulting output signals. Process 20 configures (30a) the DIB according to FIG. 2 to obtain Gain_II and Gain_QQ; and process 20 configures (30b) the DIB according to FIG. 3 to obtain Gain_IQ and Gain_QI. Process 20 obtains (32) Phase_IQ, Phase_II, Phase_QQ, and Phase_QI in a similar manner. That is, process 20 configures (32a) the DIB according to FIG. 2 to obtain Phase_II and Phase_QQ; and process 20 configures (32b) the DIB according to FIG. 3 to obtain Phase_IQ and Phase_QI.

Process 20 uses the foregoing values and Eqs. 4 to obtain (34) I/Qsrc_offset_M, I/Qsrc_offset_P, I/Qcap_offset_M, and I/Qcap_offset_P, as described above.

Process 20 uses I/Qsrc_offset_M, I/Qsrc_offset_P, I/Qcap_offset_M, and I/Qcap_offset_P to calibrate (36) source and capture paths of ATE 10. For example, if ATE 10 normally transmits signals to source I transmission lines 15 at a time X, process 20 may calibrate ATE 10 to transmit those same signals at a time (X−I/Qsrc_offset_P), in order to compensate for the I/Qsrc_offset_P phase delay that results from I transmission lines 15 in the source path. Process 20 may cause ATE 10 to amplify its signals on I transmission lines 15 to compensate for the loss corresponding to I/Qsrc_offset_M. Process 20 may perform similar calibrations on capture path 14.

ATE 10 may be a very high frequency alternating current (VHFAC) device. Process 20 may be used with baseband calibration signals of, e.g., 20 KHz to 70 KHz, VHFAC signals, and/or high-speed differential digital signals. It is noted that the foregoing describes only one exemplary structure for use in calibrating ATE 10.

It is noted that the processes described herein are not limited to use with the hardware and software described herein. All or part of the processes and circuitry described herein can be implemented using digital electronic circuitry, computer hardware, firmware, software, or some combination thereof.

The processes described herein can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the processes described herein can be performed by one or more programmable processors executing one or more computer programs to perform the functions of the processes. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Elements of different embodiments described herein may be combined to form other embodiments not specifically set forth above. The blocks of FIG. 4 may be performed in a different order than that depicted. Other embodiments not specifically described herein are also within the scope of the following claims.

What is claimed is:

1. A method of calibrating automatic test equipment (ATE) comprising transmission paths that transport signals, the method comprising:
   obtaining amplitude gains of the signals across the transmission paths;
   obtaining phase delays of the signals across the transmission paths;
   obtaining magnitude and phase offsets associated with the signals based on the amplitude gains and the phase delays; and
   calibrating the ATE using the magnitude and phase offsets;
   wherein the transmission paths comprise an inphase (I) transmission path and a quadrature (Q) transmission path; and
   wherein the amplitude gains comprise a Gain_II gain across the I transmission path, a Gain_QQ gain across the Q transmission path, and gains across connections of the I and Q transmission paths wherein the gains across the connections of the I and Q transmission paths comprises a Gain_IQ gain from the I transmission path to the Q transmission path, and a Gain_QI gain from the Q transmission path to the I transmission path.

2. The method of claim 1, wherein the amplitude gains comprise positive or negative deviations from initial values of the signals.

3. The method of claim 1, wherein the phase delays comprise a Phase_II phase delay across the I transmission path, a Phase_QQ phase delay across the Q transmission path, and phase delays across connections of the I and Q transmission paths.

4. The method of claim 3, wherein the phase delays across the connections of the I and Q transmission paths comprises a Phase_IQ phase delay from the I transmission path to the Q transmission path, and a Phase_QI phase delay from the Q transmission path to the I transmission path.

5. The method of claim 4, wherein the ATE comprises a source path and a capture path, the source path to provide signals to a device under test (DUT) and the capture path to receive signals from the DUT;
   wherein obtaining the magnitude and phase offsets comprises calculating a source-path magnitude offset and a source-path phase offset for the source path, and calculating a capture-path magnitude offset and a capture-path phase offset for the capture path; and
   wherein calibrating comprises calibrating the source path using the source-path magnitude offset and the source-path phase offset, and calibrating the capture path using the capture-path magnitude offset and the capture-path phase offset.

6. The method of claim 5, wherein the source-path magnitude offset is calculated as follows: Gain_II-Gain_QI;
   wherein the source-path phase offset is calculated as follows:
   Phase_II-Phase QI;
   wherein the capture-path magnitude offset is calculated as follows:
   Gain_II-Gain_IQ; and
   wherein the capture-path phase offset is calculated as follows: Phase_II-PhaseIQ.

7. The method of claim 5, wherein the source-path magnitude offset is calculated as follows: Gain_IQ-Gain_QQ;
   wherein the source-path phase offset is calculated as follows:
   Phase_IQ-Phase QQ;
   wherein the capture-path magnitude offset is calculated as follows:
   Gain_QI-Gain_QQ; and
   wherein the capture-path phase offset is calculated as follows:
   Phase_QI-PhaseQQ.

8. A machine-readable medium that stores executable instructions to calibrate automatic test equipment (ATE) having transmission paths, the instructions to cause one or more machines to:
   obtain amplitude gains of the signals across the transmission paths;
   obtain phase delays of the signals across the transmission paths;
   obtain magnitude and phase offsets associated with the signals based on the amplitude gains and the phase delays; and
   calibrate the ATE using the magnitude and phase offsets;
   wherein the transmission paths comprise an inphase (I) transmission path and a quadrature (Q) transmission path; and
   wherein the amplitude gains comprise a Gain_II gain across the I transmission path, a Gain_QQ gain across the Q transmission path, and gains across connections of the I and Q transmission paths wherein the gains across the connections of the I and Q transmission paths comprises a Gain_IQ gain from the I transmission path to the Q transmission path, and a Gain_QI gain from the Q transmission path to the transmission path.

9. The machine-readable medium of claim 8, wherein the amplitude gains comprise positive or negative deviations from initial values of the signals.

10. The machine-readable medium of claim 8, wherein the phase delays comprise a Phase_II phase delay across the I transmission path, a Phase_QQ phase delay across the Q transmission path, and phase delays across connections of the I and Q transmission paths.

11. The machine-readable medium of claim 10, wherein the phase delays across the connections of the I and Q transmission paths comprises a Phase_IQ phase delay from the I transmission path to the Q transmission path, and a Phase_QI phase delay from the Q transmission path to the I transmission path.

12. The machine-readable medium of claim 11, wherein the ATE comprises a source path and a capture path, the source path to provide signals to a device under test (DUT) and the capture path to receive signals from the DUT;
   wherein obtaining the magnitude and phase offsets comprises calculating a source-path magnitude offset and a source-path phase offset for the source path, and calculating a capture-path magnitude offset and a capture-path phase offset for the capture path; and wherein calibrating comprises calibrating the source path using the source-path magnitude offset and the source-path phase offset, and calibrating the capture path using the capture-path magnitude offset and the capture-path phase offset.

13. The machine-readable medium of claim 12, wherein the source-path magnitude offset is calculated as follows: Gain_II-Gain_QI;

wherein the source-path phase offset is calculated as follows:
Phase_II-Phase QI;
wherein the capture-path magnitude offset is calculated as follows:
Gain_II-Gain_IQ; and
wherein the capture-path phase offset is calculated as follows: Phase_II-PhaseIQ.

14. The machine-readable medium of claim 12, wherein the source-path magnitude offset is calculated as follows: Gain_IQ-Gain_QQ;

wherein the source-path phase offset is calculated as follows:
Phase_IQ-Phase QQ;
wherein the capture-path magnitude offset is calculated as follows:
Gain_QI-Gain_QQ; and
wherein the capture-path phase offset is calculated as follows:
Phase_QI-PhaseQQ.

15. Automatic test equipment (ATE) comprising:
inphase transmission paths; and
quadrature transmission paths, the inphase transmission paths and the quadrature transmission paths transmitting signals that are 90° out of phase; and a processing device to:
obtain amplitude gains of signals across the inphase transmission paths and across the quadrature transmission paths;
obtain phase delays of signals across the inphase transmission paths and across the quadrature transmission paths;
obtain magnitude and phase offsets associated with the signals based on the amplitude gains and the phase delays; and
calibrate the ATE using the magnitude and phase offsets;
wherein the amplitude gains comprise a Gain_II gain across an inphase transmission path, a Gain_QQ gain across a quadrature transmission path, and gains across connections of the inphase and quadrature transmission paths wherein the gains across the connections of the Inphase and Quadrature transmission paths comprises a Gain_IQ gain from the Inphase transmission path to the Quadrature transmission path, and a Gain_QI gain from the Quadrature transmission path to the Inphase transmission path.

16. The ATE of claim 15, comprising:
a source path to transmit signals to a device under test (DUT); and
a capture path to receive signals from the DUT;
wherein separate magnitude and phase offsets are obtained for the source path and the capture path; and
wherein calibrating comprises calibrating both the source path and the capture path using the separate magnitude and phase offsets.

* * * * *

UNITED STATES PATENT AND TRADEMARK OFFICE
CERTIFICATE OF CORRECTION

| | | |
|---|---|---|
| PATENT NO. | : 7,643,545 B2 | Page 1 of 1 |
| APPLICATION NO. | : 11/094934 | |
| DATED | : January 5, 2010 | |
| INVENTOR(S) | : Kadota | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1,194 days.

Signed and Sealed this

Fifteenth Day of March, 2011

David J. Kappos
*Director of the United States Patent and Trademark Office*